United States Patent
De Vries

(10) Patent No.: US 8,815,750 B2
(45) Date of Patent: Aug. 26, 2014

(54) METHOD FOR MANUFACTURING A BARRIER ON A SHEET AND A SHEET FOR PV MODULES

(75) Inventor: Hindrik De Vries, Tilburg (NL)

(73) Assignee: Fujifilm Manufacturing Europe B.V. (NL)

( * ) Notice: Subject to any disclaimer, the term of this patent is extended or adjusted under 35 U.S.C. 154(b) by 0 days.

(21) Appl. No.: 13/811,338

(22) PCT Filed: Jul. 12, 2011

(86) PCT No.: PCT/GB2011/051306
§ 371 (c)(1),
(2), (4) Date: Jan. 21, 2013

(87) PCT Pub. No.: WO2012/010867
PCT Pub. Date: Jan. 26, 2012

(65) Prior Publication Data
US 2013/0122719 A1    May 16, 2013

(30) Foreign Application Priority Data
Jul. 21, 2010   (GB) .................................. 1012226.5

(51) Int. Cl.
*H01L 21/31*   (2006.01)

(52) U.S. Cl.
USPC ........................................................ 438/761

(58) Field of Classification Search
USPC .......................... 438/761, 763, 778, 788, 792
See application file for complete search history.

(56) References Cited

U.S. PATENT DOCUMENTS

| | | | |
|---|---|---|---|
| 6,413,645 | B1 | 7/2002 | Graff et al. |
| 6,774,569 | B2 | 8/2004 | de Vries et al. |
| 7,166,335 | B2 | 1/2007 | Fuluda et al. |
| 7,298,072 | B2 | 11/2007 | Czeremuszkin et al. |
| 7,399,944 | B2 | 7/2008 | DeVries et al. |
| 7,651,741 | B2 | 1/2010 | Yamada et al. |
| 8,323,753 | B2 | 12/2012 | De Vries et al. |
| 2005/0019503 | A1 | 1/2005 | Komada |
| 2006/0166023 | A1 | 7/2006 | Yoshikata et al. |
| 2008/0317974 | A1 | 12/2008 | de Vries et al. |
| 2010/0255625 | A1 | 10/2010 | De Vries |
| 2011/0014424 | A1 | 1/2011 | De Vries |
| 2011/0049491 | A1 | 3/2011 | De Vries et al. |

FOREIGN PATENT DOCUMENTS

| | | | | |
|---|---|---|---|---|
| EP | 2226832 A1 | 8/2010 | | |
| JP | 2003171770 A | 6/2003 | | |
| JP | 2006168340 A | 6/2006 | | |
| WO | 99/04411 A1 | 1/1999 | | |
| WO | 2007/089146 A1 | 8/2007 | | |
| WO | 2008/147184 A2 | 12/2008 | | |
| WO | WO2009/099325 A1 | * | 8/2009 | ............... H05H 1/24 |
| WO | WO 2009104957 A1 | * | 8/2009 | ............... H01J 37/32 |

* cited by examiner

*Primary Examiner* — Reema Patel
(74) *Attorney, Agent, or Firm* — Banner & Witcoff, Ltd.

(57) ABSTRACT

A method for manufacturing a barrier layer (14) on a flexible substrate (6), and a sheet structure (12) having a combination of these elements. The method comprises depositing an inorganic layer on the substrate in a treatment space (5), the treatment space (5) being formed between at least two electrodes (2, 3) for generating an atmospheric pressure glow discharge plasma. At least three subsequent layers of the same material are deposited on the substrate (6a, 6b), each layer being at most 20 nm in thickness.

16 Claims, 4 Drawing Sheets

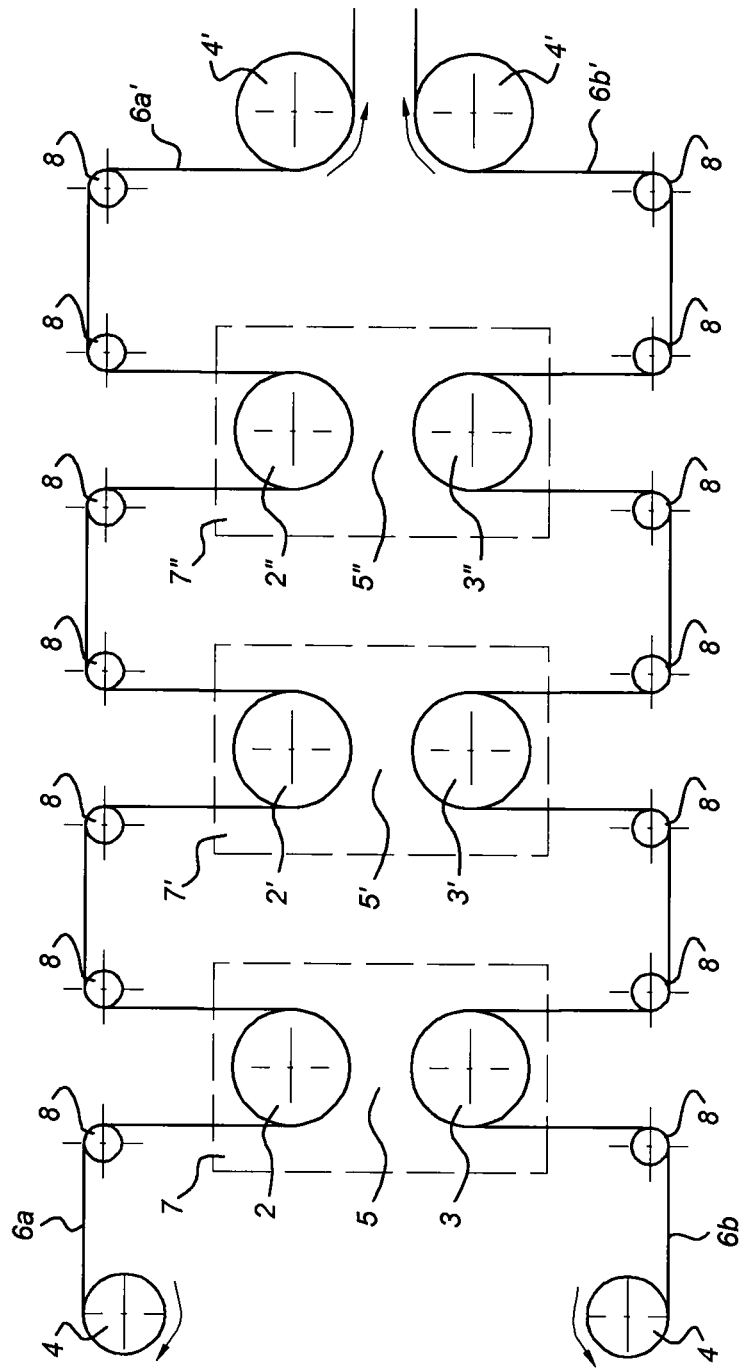

METHOD FOR MANUFACTURING A BARRIER ON A SHEET AND A SHEET FOR PV MODULES

RELATED APPLICATION DATA

This application is a National Stage Application under 35 U.S.C. 371 of co-pending PCT application PCT/GB2011/051306 designating the United States and filed Jul. 12, 2011; which claims the benefit of GB patent application number 1012226.5 and filed Jul. 21, 2010 each of which are hereby incorporated by reference in their entireties.

TECHNICAL FIELD

The present invention relates to a method for manufacturing a barrier layer on a flexible sheet. More particularly, the present invention relates to a method for manufacturing a barrier layer on a flexible substrate, comprising depositing an inorganic layer on the substrate in a treatment space, the treatment space being formed between at least two electrodes for generating an atmospheric pressure glow discharge plasma. In further aspects, a method is provided for manufacturing a back or front sheet which can be used for PV modules.

BACKGROUND ART

Photovoltaic ("PV") modules are large-area optoelectronic devices that convert solar radiation directly into electrical energy. PV modules are made by interconnecting individually formed and separate solar cells, e.g., multi-crystalline or mono-crystalline silicon solar cells, and then mechanically supporting and protecting the solar cells against environmental degradation by integrating the cells into a laminated PV module. The laminated modules generally comprise a rigid and transparent protective front panel or sheet, and a rear panel or sheet which is typically called a back-sheet. Forming a sandwiched arrangement between the front panel and back-sheet are the interconnected solar cells and an encapsulant which is transparent to solar radiation. The front panel and back-sheet encapsulate the solar cell(s) and provide protection from environmental damage. The primary function of the back sheet is to provide the low water vapor transmission, UV and oxygen barrier properties and necessary to protect the silicon wafers (photocells) from degradation induced by reaction with water, oxygen or UV radiation. Because the silicon wafers are generally encapsulated in ethylene vinyl acetate (EVA) the back-sheet material should adhere well to EVA when the components are laminated together in a thermoforming process.

US2006/0166023 describes back-side protective sheets for PV battery module comprising a vapor-deposited film of an inorganic oxide in a vacuum chamber. EP1134073 describes a gas barrier film comprising a vapor deposited film prepared by vapor-deposition in a vacuum chamber.

Documents WO 2008/147 184 and EP 2 226 832 A, both from applicant, disclose an atmospheric pressure plasma treatment apparatus and method.

JP 2003-171 770 A discloses an apparatus for creating an anti-reflective layer on a substrate, the apparatus comprising a plurality of discharge sections. However, JP 2003-171 770 does not disclose the conditions for creating an improved barrier layer.

WO 2009/031886 A by applicant also discloses an apparatus for plasma treatment having multiple treatment spaces. Again, the conditions for creating an improved barrier layer are not disclosed.

DISCLOSURE OF THE INVENTION

In the art of manufacturing and commercialization of flexible thin substrate material (e.g. back sheets or front-sheets for PV cells or PV modules), characteristics of the material such as displaying good barrier properties, good handling properties and being defect-free are desired, as well as a more cost-effective and a simpler process.

According to the present invention, a method is provided for manufacturing a barrier layer, in particular a water vapour barrier layer, on a flexible substrate, comprising depositing an inorganic layer on the substrate in a treatment space, the treatment space being formed between at least two electrodes for generating an atmospheric pressure glow discharge plasma. The barrier layer is characterized in that it is formed by deposition of at least three inorganic layers after each other on the substrate, each of the deposited inorganic layers being at most 20 nm in thickness. All of the at least three subsequent inorganic layer depositions can take place in the same treatment space, or in two or more separate treatment spaces. For example, one treatment space per inorganic layer deposition may be provided. Each of the at least three inorganic layers can be formed of essentially the same material (for example, by using essentially the same precursor gas compositions in each of the treatment spaces). However, each of the at least three inorganic layers can be formed using two, three or more different materials (for example, by using various the precursor gas compositions in the different treatment spaces).

The method according the invention provides a treated substrate having good characteristics for a large number of applications, such as a front or back sheet for PV applications. Because of the layers being formed by at most 20 nm at a time, a defect free barrier layer can be obtained, which in total still has an acceptable water vapor transmission ratio.

In a further embodiment, a gas atmosphere is provided in each treatment space, the gas atmosphere comprising between 4 and 25% of oxygen, e.g. between 6 and 21% of oxygen. This is advantageous as less defects are being formed due to e.g. dust forming processes.

Each layer deposited in a further embodiment of the present invention is at least 5 nm thick, e.g. at least 15 nm thick. This assures that the WVTR of the resulting layer is sufficient for many applications.

In a further embodiment, the deposited layer has dynamic scaling components properties comprising a $\alpha$-value of about 0.9, $\beta$-value below 0.2 and a z-value above 6. A surface of the substrate treated according to the present invention can be characterized by interrelated scaling components, the scaling components comprising a roughness exponent $\alpha$, a growth exponent $\beta$ and a dynamic exponent z. The ranges indicated provide a class of surface characteristics which makes the treated substrate extremely useful.

The at least three subsequent layer depositions are being executed in separate treatment spaces in an embodiment according to the present invention. This allows to fine tune every step in the present method to obtain a treated substrate with the desired characteristics. In a further embodiment, two of the at least three subsequent layer depositions are being executed in the same treatment space. This enhances the efficiency obtained, as only a single treatment space is needed for two of the at least three deposition steps.

In a further embodiment, the present invention method further comprises manufacturing a sheet structure, the sheet structure comprising in order a substrate—a barrier layer—an adhesive layer—a second substrate, by laminating a substrate with a barrier layer and a second substrate with an adhesive layer on the facing surface of the barrier layer. The combination of a substrate and barrier layer as produced using the present invention embodiments provide a very good and uniform layer, which is particularly suited to be adhered to a second substrate using an adhesive layer. The resulting sheet structure is particularly suitable for use as front or back sheet in PV applications.

In a further embodiment, the present invention method further comprises manufacturing a sheet structure, the sheet structure comprising in order a substrate—a barrier layer—an adhesive layer—a barrier layer and a substrate, by laminating two substrates with a barrier layer with an adhesive layer on the facing surface of the barrier layer.

In a further embodiment, the method further comprises laminating two or more sheet structures with an additional adhesive layer in between. By further stacking multi-layered sheet structures, the WVTR characteristics may be even further improved.

In a further embodiment, the method further comprises treating the second substrate using an atmospheric pressure glow discharge plasma. This will enhance the proper and good adhesion using the adhesive layer to the treated substrate with the barrier layer.

The substrate and the second substrate are provided on a roll to obtain the sheet structure in a continuous process in a further embodiment, which provides for a very efficient manufacturing process. The substrate and second substrate are treated simultaneously in a further embodiment, to further enhance the efficiency. In further embodiments, two substrates are treated in the same treatment space, which can further enhance the efficiency of production of sheet structures.

In a further embodiment, the substrate is a substrate of PET or PEN with a thickness of about 20-100 μm. In an even further embodiment, the second substrate is a substrate of PET or PEN with a thickness of about 100-300 μm. Eventually, a thin sheet structure is formed having very good characteristics, e.g. for use in PV applications.

In further aspects of the present invention, a roll of treated substrate is provided for use in a roll-to-roll application prepared by the method according to any one of the present invention embodiments. Furthermore, a roll of a multi-layered sheet structure is provided for a PV back or front sheet application comprising a multi-layer sheet structure. In an even further aspect, a device is provided comprising a part of a roll according to the present invention embodiment, e.g. a PV module.

SHORT DESCRIPTION OF THE FIGURES

The present invention will be discussed in more detail below, using a number of exemplary embodiments, with reference to the attached drawings, in which FIG. 1 shows a schematic view of a plasma generation apparatus in which the present invention may be embodied;

FIG. 2a shows a schematic view of an embodiment;

DETAILED DESCRIPTION OF THE INVENTION

Figure 1:
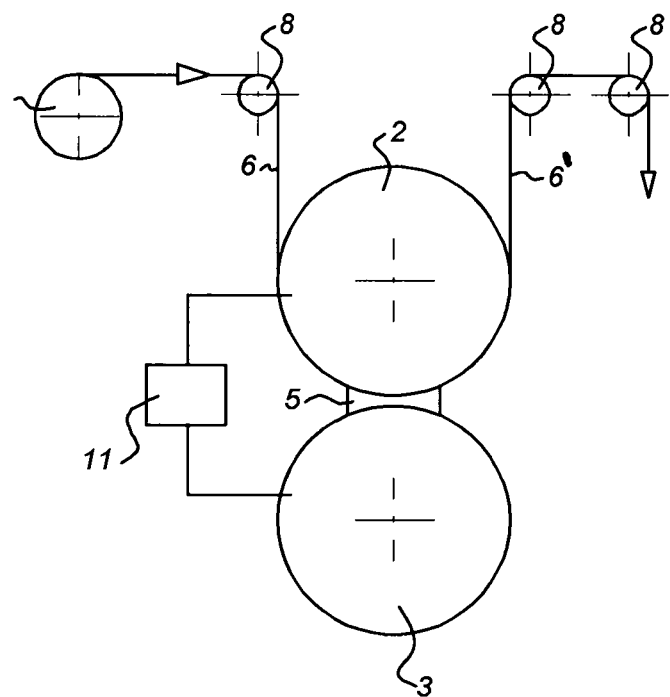

FIG. 1 shows a schematic view of a simplified exemplary plasma apparatus 10 in which the present invention embodiments may be applied. The plasma apparatus 10 according to the present invention embodiments comprises at least three treatment spaces 5, 5', 5", in FIG. 1 shown as a single treatment space 5 for reasons of simplicity.

Each treatment space 5 may be a treatment chamber within an enclosure 7 (not shown in FIG. 1) or a treatment spaces 5 with an open structure (as shown in FIG. 1). Two curved electrodes 2,3 are provided, e.g. cylinder shaped electrodes 2, 3. In general the electrode couples or electrodes 2,3 are provided with a dielectric barrier in order to be able to generate and sustain a glow discharge at atmospheric pressure in the treatment space 5.

A substrate 6 is fed from a source roll 4 through the treatment space 5 to obtain a treated substrate 6', by depositing a layer on the surface of the substrate 6, or by treating the surface of the substrate 6 for subsequent processing). Guiding or tensioning rollers 8 are provided to assure the substrate 6 is kept tightly on the surface of the electrodes 2, 3. As is example, the treated substrates 6' is stored (e.g. on a roll) as semi-product for further use on other processes.

In FIG. 2a, a schematic view is shown of a plasma apparatus 10 in which embodiments of the present invention can be performed. In this case, the plasma apparatus is provided with three separate treatment spaces 5, 5', 5" in three distinct enclosures 7, 7', 7", and in each treatment space 5, 5', 5" two substrates 6a, 6b are treated simultaneously. Each treatment space 5, 5', 5" is provided by electrode pairs 2,3; 2', 3', 2", 3", all in a manner similar to the one described with reference to FIG. 1. At specific locations, guiding rollers 8 are provided to properly guide the substrates 6a, 6b through the plasma apparatus 10. Collection rollers 4' are provided as an example to collect the treated substrates 6a', 6b'.

Figure 2B:
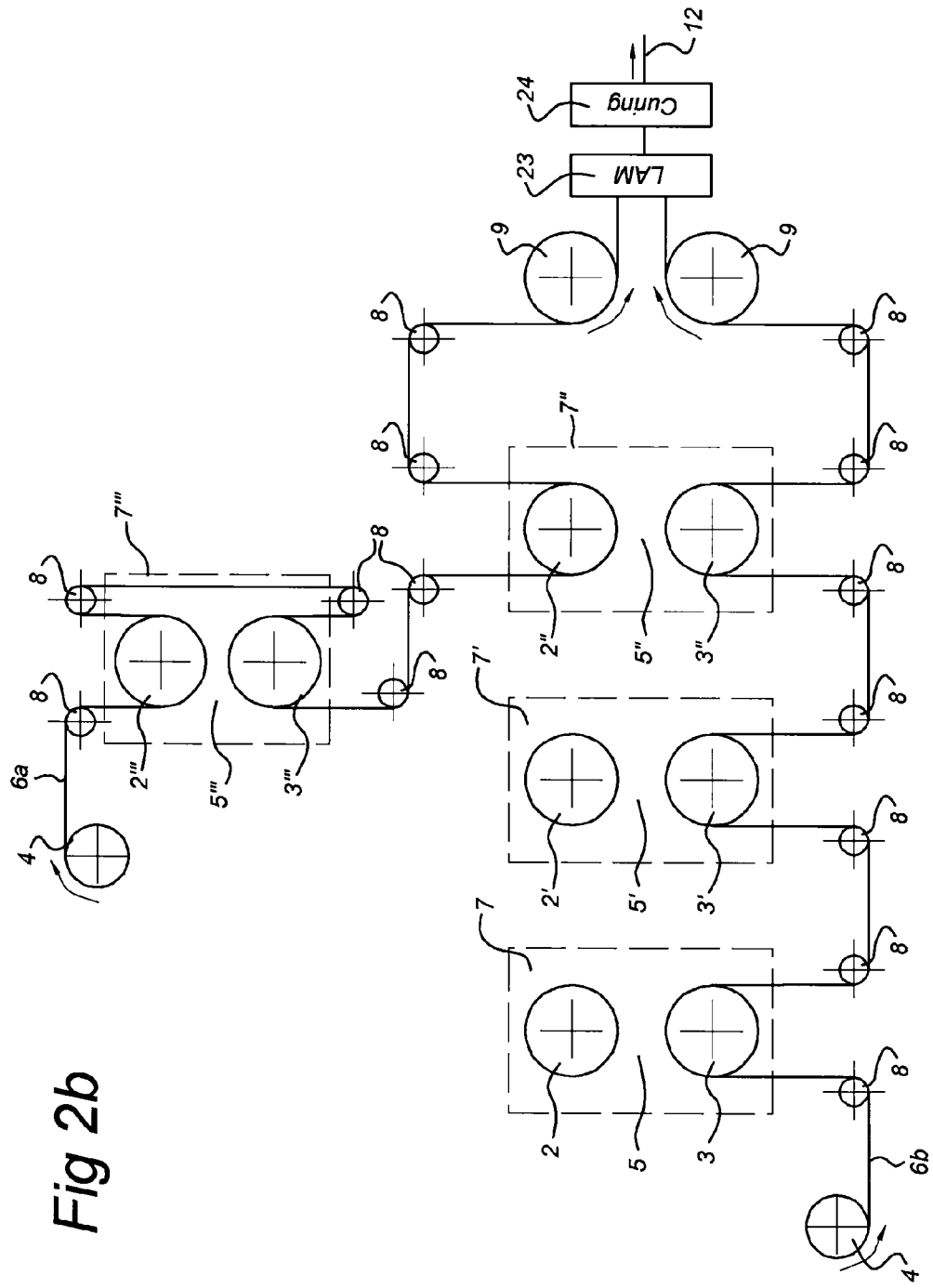
FIG. 2b shows a schematic view of an alternative embodiment.

In the example of FIG. 2a two substrates 6a, 6b are simultaneously fed through the same treatment spaces 5, 5', 5" however this is not necessary. FIG. 2b shows an alternative set-up of the plasma apparatus 10, in which a first substrate 6a is treated twice in a separate treatment space 5''' (having an optional enclosure 7''' and electrode pairs 2''', 3'''). A second substrate 6b is treated consecutively in three treatment spaces 5, 5', 5" similar to the embodiment of FIG. 2a. A third treatment of the first substrate 6a is executed simultaneously with the third treatment of the second substrate 6b in treatment space 5".

A characterizing feature of the present invention embodiments is that the substrate 6 is fed through at least three (same or different) treatment spaces 5 consecutively. In each treatment space 5,5',5" etc, an inorganic layer is deposited with an inorganic barrier amount ranging from 5 nm to at most 20 nm in thickness. Depositions of less than 5 nm will not result in barriers having a good water vapour transmission ratio (WVTR) property. Depositions of more than 20 nm in one treatment space 5 are susceptible for defects, e.g. caused by dust.

As a result of the present method embodiments (leading the substrate 6 through at least three treatment spaces 5, 5', 5") a treated substrate 6' is provided having a deposited inorganic layer 14 (see FIG. 3a) from which as result from the three consecutive depositions the inorganic layer may have a thickness of 15 nm or above. As a result of the use of at least three treatment spaces 5, 5', 5" the maximum barrier thickness is not limited and could be made over even 450 nm however from economical point of view a thickness amount of at most 50 nm is useable.

The electrodes 2,3; 2',3'; 2",3" may be mounted to allow rotation in operation, e.g. using a mounting shaft and/or bearing arrangements. The electrode 2,3; 2',3'; 2",3"; may be provided as a rolling electrode 2,3; 2',3'; 2",3" which is freely rotating or may be driven at certain angular speed using controller and drive units (which as such are known to the skilled person). As a further alternative, the electrodes 2, 3 may be provided using an electrode-couple having a flat/rotary or rotary/flat or even a flat/flat configuration. The electrodes 2, 3 may also be formed from multiple segments.

For efficiency and uniformity of deposition reasons, two substrates 6a, 6b may be treated simultaneously in the same treatment spaces 5, 5', 5", 5''', as shown in the embodiments of FIGS. 2a and b.

The substrates 6a, 6b may be provided in the treatment spaces 5 from a respective roll 4, allowing a continuous feed of the substrates 6a, 6b to the treatment space 5 using the guiding rollers 8. Treated substrates 6a', 6b' leave the treatment spaces 5, 5', 5" etc. for further processing or e.g. for storage.

Treating the two substrates 6a, 6b in the said at least three same treatment spaces 5, 5', 5" simultaneously provides a much more uniform and effective plasma treatment as compared to the application of using separate treatment processes for each substrate 6a, 6b, separately.

The formation of a glow discharge plasma may be stimulated by controlling the displacement current (dynamic matching) using a plasma control unit 11 (see FIG. 1) connected to the electrodes 2, 3; 2',3';2",3" leading to a uniform activation of the surface of substrate 6a, 6b in the treatment space 5. The plasma control unit 11 e.g. comprises a power supply and associated control circuitry as described in the pending international patent application PCT/NL2006/050209, and European patent applications EP-A-1381257, EP-A-1626613 of applicant, which are herein incorporated by reference.

In another embodiment each electrode couple can have its own power control unit 11 to electrode couple 2,3; electrode couple 2',3', electrode couple 2",3" respectively and each said power unit comprises a power supply and associated control circuitry as described in the pending international patent application PCT/NL2006/050209, and European patent applications EP-A-1381257, EP-A-1626613 of applicant, which are herein incorporated by reference.

In the treatment spaces 5 a combination of gasses may be introduced from one or more gas supply devices (not shown), including a pre-cursor. The gas supply devices may be provided with storage, supply and mixing components as known to the skilled person. The purpose is to have the precursor decomposed in the treatment spaces to a chemical compound or chemical element which is deposited on the surfaces of the substrate(s). It may be efficient to have many different precursors in each different treatment space 5 however in the case for a sheet as back sheet in PV-application it is exemplary to have one precursor resulting in one and the same deposition composition.

In general the combination of gasses comprises in the treatment space 5 (besides the precursor) an active gas like for example oxygen and a mixture of inert gases. In one embodiment this combination of gasses is controlled and comprises oxygen as active gas in a range from 4 to 25%. In another embodiment said combination may comprise oxygen in a range of 6 to 21%. In another embodiment as gas mixture air is used.

The duty cycle, defined as the power on time divided by the sum of the power on and power of time of these pulsing examples is large, typically in the range of 90% or higher, e.g. even 100%.

The power supply or power supplies (as each electrode couple 2, 3 may have a power supply independent from other electrode couple(s) 2, 3) can be a power supply providing a wide range of frequencies. For example it can provide a low frequency (f=10-450 kHz) electrical signal during the on-time. It can also provide a high frequency electrical signal for example f=450 kHz-30 MHz. Also other frequencies can be provided like from 450 kHz-1 MHz or from 1 to 20 MHz and the like.

Good results are obtained in general with a precursor concentration from 2 to 500 ppm of the gas composition and for example an oxygen concentration of 4% of the gas phase, or more, e.g. 6%, but less than 25% for example 10%.

Although oxygen as a reactive gas in this invention has a many advantages also other reactive gases might be used like for example hydrogen, carbon dioxide, ammonia, oxides of nitrogen, and the like. It may be advantageous to use a different gas compositions per treatment space.

In the present invention precursors can be can be selected from (but are not limited to): $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, or $Ru_3(CO)_{12}$, Tantalum Ethoxide ($Ta(OC_2H_5)_5$), Tetra Dimethyl amino Titanium (or TDMAT) $SiH_4$ $CH_4$, $B_2H_6$ or $BCl_3$, $WF_6$, $TiCl_4$, $GeH_4$, $Ge_2H_6Si_2H_6$ ($GeH_3)_3SiH$, ($GeH_3)_2SiH_2$, hexamethyldisiloxane (HMDSO), tetramethyldisiloxane (TMDSO), 1,1,3,3,5,5-hexamethyltrisiloxane, hexamethylcyclotetrasiloxane, octamethylcyclotetrasiloxane, decamethylcyclopentanesiloxane, tetraethoxysilane (TEOS), methyltrimethoxysilane, methyltriethoxysilane, dimethyldimethoxysilane, dimethyldiethoxysilane, trimethylethoxysilane, ethyltrimethoxysilane, ethyltriethoxysilane, n-propyltrimethoxysilane, n-propyltriethoxysilane, n-butyltrimethoxysilane, i-butyltrimethoxysilane, n-hexyltrimethoxysilane, phenyltrimethoxysilane, vinyltrimethoxysilane, vinyltriethoxysilane, aminomethyltrimethylsilane, dimethyldimethylaminosilane, dimethylaminotrimethylsilane, allylaminotrimethylsilane, diethylaminodimethylsilane, 1-trimethylsilylpyrrole, 1-trimethylsilylpyrrolidine, isopropylaminomethyltrimethylsilane, diethylaminotrimethylsilane, anilinotrimethylsilane, 2-piperidinoethyltrimethylsilane, 3-butylaminopropyltrimethylsilane, 3-piperidinopropyltrimethylsilane, bis(dimethylamino)methylsilane, 1-trimethylsilylimidazole, bis(ethylamino)dimethylsilane, bis(butylamino)dimethylsilane, 2-aminoethylaminomethyldimethylphenylsilane, 3-(4-methylpiperazinopropyl)trimethylsilane, dimethylphenylpiperazinomethylsilane, butyldimethyl-3-piperazinopropylsilane, dianilinodimethylsilane, bis(dimethylamino)diphenylsilane, 1,1,3,3-tetramethyldisilazane, 1,3-bis(chloromethyl)-1,1,3,3-tetramethyldisilazane, hexamethyldisilazane, 1,3-divinyl-1,1,3,3-tetramethyldisilazane, dibutyltin diacetate, aluminum isopropoxide, tris(2,4-pentadionato)aluminum, dibutyldiethoxytin, butyltin tris(2,4-pentanedionato), tetraethoxytin, methyltriethoxytin, diethyldiethoxytin, triisopropylethoxytin, ethylethoxytin, methylmethoxytin, isopropylisopropoxytin, tetrabutoxytin, diethoxytin, dimethoxytin, diisopropoxytin, dibutoxytin, dibutyryloxytin, diethyltin, tetrabutyltin, tin bis(2,4-pentanedionato), ethyltin acetoacetonato, ethoxytin (2,4-pentanedionato), dimethyltin (2,4-pentanedionato), diacetomethylacetatotin, diacetoxytin, dibutoxydiacetoxytin, diacetoxytin diacetoacetonato, tin hydride, tin dichloride, tin tetrachloride, triethoxytitanium, trimethoxytitanium, triisopropoxytitanium, tributoxytitanium, tetraethoxytitanium, tetraisopropoxytitanium, methyldimethoxytitanium, ethyltriethoxytitanium, methyltripropoxytitanium, triethyltitanium, triisopropyltitanium, tributyltitanium, tetraethyltitanium, tetraisopropyltitanium, tetrabutyltitanium, tetradimethylaminotitanium, dimethyltitanium di(2,4-pentanedionato), ethyltitanium tri(2,4-pentanedionato), titanium tris(2,4-pentanedionato), titanium tris(acetomethylacetato), triacetoxytitanium, dipropoxypropionyloxytitanium, dibutyryloxytitanium,monotitanium hydride, dititanium hydride, trichlorotitanium, tetrachlorotitanium, tetraethylsilane, tetramethylsilane, tetraisopropylsilane, tetrabutylsilane, tetraisopropoxysilane, diethylsilane di(2,4-pentanedionato), methyltriethoxysilane, ethyltriethoxysilane, silane tetrahydride, disilane hexahydride, tetrachlorosilane, methyltrichlorosilane, diethyldichlorosilane, isopropoxyaluminum, tris(2,4-pentanedionato)nickel, bis(2,4-pentanedionato)manganese, isopropoxyboron, tri-n-butoxyantimony, tri-n-butylantimony, di-n-butylbis(2,4-pentanedionato)tin, di-n-butyldiacetoxytin, di-t-butyldiacetoxytin, tetraisopropoxytin, zinc di(2,4-pentanedionate), and combinations thereof. Furthermore precursors can be used as for example described in EP-A-1351321 or EP-A-1371752.

In the present invention embodiments the plasma gas including the precursor to be deposited via atmospheric pressure glow discharge plasma can be brought into contact with two resin substrates 6a, 6b (e.g. in the form of continuous rolls) synchronously. At least three treatment spaces 5, 5', 5" are being used as can be seen in the embodiment of FIG. 2a. These steps will result in less consumption of precursor and/or carrier materials and as such to much more efficient application of plasma gas including precursor to be used onto the substrates 6a, 6b, which provides benefits from economical and commercialization point of view. The embodiments described with reference to FIGS. 1, 2a and 2b above are only illustrative for plasma gas contacting two rolls of resins (i.e. substrates 6a, 6b) synchronously, it may be understood that the method may include also the use of a remote plasma device and jetting the plasma gas including the precursor element to be deposited onto the two resin rolls 6a, 6b synchronously. Further the use of atmospheric pressure glow discharge avoids the use of complex and expensive vacuum equipment which makes the process simpler and more cost-effective.

As a result of the deposition on a substrate 6 an inorganic barrier 14 is formed with a thickness of 15 nm or above. Although such low deposition amount of 15 nm or above on a flexible substrate 6 have been described in literature the use of a substrate prepared in atmospheric pressure with such low amounts of inorganic barrier in a front- or back sheet application for PV-modules will fail as these barrier layers have too many defects and are not uniform enough especially visible in the effects in adhesion of the PV sheet after exposure to the Damp Heat test.

Further as a result of this uniform depositions it has been possible to prepare sheets with an inorganic barrier layer 14 characterized by scaling components comprising a roughness exponent $\alpha$ with a value of about 0.9, a growth exponent $\beta$ of a value of less than 0.2 and a dynamic exponent z with values above 6. The surface of the resulting inorganic barrier layer 14 can be characterized by these interrelated scaling components, the scaling components comprising a roughness exponent $\alpha$, a growth exponent $\beta$ and a dynamic exponent z. The treated substrates 6' as described above, having as scaling parameters $\alpha\sim0.9$, $\beta<0.1$, $z\sim9$ and $\alpha\sim0.83$, $\beta<0.1$, and $z\sim8$, respectively, do not fall into any known universality class. Also further embodiments fall into this yet unknown universality class, wherein the growth exponent $\beta<0.2$ and the dynamic exponent $z>6$. Further examples which expose advantageous characteristics relate to a treated substrate 6' where the growth exponent $\beta<0.1$, e.g. $\beta<0.01$. Other examples include but are not limited to treated substrates 6' wherein the dynamic exponent z has a value of 9 or even 10.

The mechanism involved is not clear but the hypothesis is that built-in defects in the organic layer are the cause of the weakness in adhesion due to dust or thermoforming of the substrate 6. By using the method as described by leading a substrate 6 at least three times through a treatment space 5 with a deposition amount controlled and oxygen amount controlled in the treatment space(s) 5 it has been demonstrated that it is possible to manufacture an intermediate sheet 6' having a thin inorganic barrier 14 which can be used as intermediate for a front- or back sheet for protecting PV-cells or PV-battery modules having good barrier properties and defect-free (which is not the case when the intermediate substrate 6' was manufactured uncontrolled in one or two deposition steps).

In an exemplary embodiment of this invention the manufactured sheet is used as back sheet using PET or PEN-substrate 6. In a exemplary embodiment the PET or PEN substrate 6 is a substrate of 20 to 100 μm.

Figure 3A:
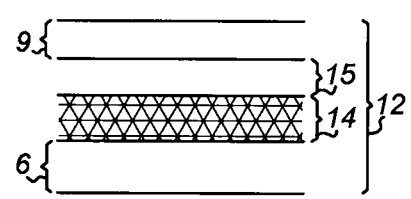
FIG. 3a shows a cross sectional view of a sheet structure according to embodiments of the present invention.

In further embodiments of the present invention, the substrate 6 with barrier is then laminated with its inorganic barrier face side upwards using an adhesive 15 to a another resin sheet 9 (or second substrate 6 with a barrier as shown in the cross sectional view of FIG. 3a), in order to obtain a laminated sheet 12. The second substrate 9 is e.g. a PET or PEN substrate with a thickness ranging from 100 to 300 μm, such as 150 μm. Other examples of substrate 9 which may be used are transparent sheets of ethylene vinyl acetate (EVA), of polyvinyl butyral (PVB), of polytetrafluoroethylene (PTFE), perfluoroalcoxy resins (PFA), i.e., copolymers of tetrafluoroethylene and perfluoroalkyl vinyl ether, tetafluoroethylene-hexafluoropropylene copolymers (FEP), tetrafluoroethylene-perfluoroalkyl vinyl ether-hexafluoro-propylene copolymers (EPE), tetrafluoroethylene-ethylene or propylenecopolymers (ETFE), polychlorotrifluoroethylene resins (PCTFE), ethylene-chlorotrifluoroethylene copolymers (ECTFE), vinylidene fluoride resins (PVDF), and polyvinyl fluorides (PVF) or coextruded sheets from polyester with EVA, polycarbonate, polyolefin, polyurethane, liquid crystal polymer, aclar, aluminum, of sputtered aluminum oxide polyester, sputtered silicon oxide or silicon nitride polyester, sputtered aluminum oxide polycarbonate, and sputtered silicon oxide or silicon nitride polycarbonate.

The substrate 9 may be pre-treated in order to facilitate a good adhesion with the selected adhesive 15. This may be the application of corona-treatment or use of an anchor-layer or subbing layer or a chemical treatment.

Figure 3B:
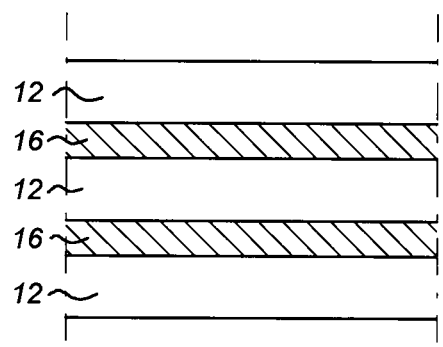
FIG. 3b shows a cross sectional view of a further embodiment of the sheet structure according to the present invention.

It may be well understood that as a result of the 2-rolls-to-1-roll operation as described above in relation to FIG. 3a, a further product multi-layer stack structure 12 can be prepared by using each produced multi-layer stack structure 12 as a starting substrate roll(s) in another separate 2 roll-to-1 roll operation step. The separate structures 12 are laminated using an additional adhesive layer 16 as shown in the cross sectional view of FIG. 3b. As a result a thicker multi-stack layer structure 12 may be prepared with even better barrier properties.

These embodiments of the sheet structure 12 may be provided using a set up similar as the one shown in FIG. 2b, where tensioning rollers 9 are provided downstream of the three treatment spaces 5, 5', 5", 5''' of each substrate 6a, 6b, to guide the treated substrates 6a', 6b' to a laminating apparatus 23 (and subsequently through an optional curing element 24) in order to provide an embodiment of the multi-layer stack structure 12. The laminating apparatus 23 (and curing element 24) may also be applied to form the sheet structure 12 as shown in FIG. 3a and or FIG. 3b.

Adhesives 15, 16 that may be applied for bonding them include all suitable thermoplastic- and elasto-plastic polymers; polymers which are curable by radiation such as by ultraviolet or electron-beam, by heat, by chemical initiators or by combinations thereof; organic or organic-containing adhesives, such as acrylics, urethanes, epoxides, polyolefins, organosilicones and others; and products of plasma-polymerization, oligomerization, or curing of organic-, organosilicon and other organometallic compounds, either volatile or deposited by other means such as spraying, sputtering, casting or dip-coating. The adhesive layer 15, 16 may suitably have a thickness of 50 nm to 1000 µm, e.g. from 100 nm to 100 µm.

As a result of the lamination step a sheet 12 is prepared consisting in order of a) a resin film 6—with thin inorganic barrier 14, b) an adhesive layer 15, c) a resin sheet 9 with very good adhesion property which is visible after exposure to the Damp Heat peel adhesion test according to ASTM D903-98 and having excellent barrier property visible in WVTR measurements. Thus the laminated sheet 12 according to the present invention embodiments can be used as back- or front sheet in PV applications, and has very good properties such as being defect-free, being dense having no cracks and being strong and good adhesive.

The barrier sheet structure 12 according to the invention may be used also in other types of devices, such as liquid crystal displays, which are known in prior art to require transparent materials impermeable to oxygen and water vapour.

EXAMPLES

Table 1 describes the WVTR and the Damp heat adhesion test results. In order to quantify water vapour transmission rates for barrier films the Mocon Aquatran is used (which uses a coloumetric cell (electrochemical cell) with a minimum detection limit of $5*10^{-4}$ g/m$^2$.day). This method provides a more sensitive and accurate permeability evaluation than the permeation measurement by using IR absorption (known to the person skilled in the art). Measurement conditions can be varied from 10-40° C. and also relative humidity usually from 60-90%.

In order to quantify the adhesion the exposure to the Damp Heat according ASTM D903-98 peel adhesion test was done. For this samples were placed in an environmental room at conditions of 85° C. and 85% Relative Humidity and evaluated after 500/1000/1500 and 2000 hours. The following abbreviations in table 2 apply: XX=tear bond on PET./inorganic barrier interface (above 50%); X=partial (below 10-50%) on interface substrate and inorganic barrier/C=some tear break at interface substrate and inorganic barrier (below 10%) and O=no tear bond at all.

In order to quantify the values of the dynamic scaling components α, β and z the surface topology of 2×2 micron was characterized using AFM (Veeco).

This determination is described in the unpublished PCT/GB2010/050208 from applicant which is hereby incorporated as reference.

Example 1-10: All electrode couples 2, 3 have been independently dynamically matched to an own power-supply 11. The power was continuously supplied to each unit (AC/800 W/200 kHz). As precursor in each treatment space 5, 2 ppm TEOS was used.

The gas mixture in each treatment space 5 contained an $O_2/N_2$-mixture and is respectively controlled on 10%/90% (except for examples 8-10).

Example 8 used in each treatment space 5 an $O_2/N_2$-mixture and is respectively controlled on 1%/99%.

Example 9 used in each treatment space 5 an $O_2/N_2$-mixture and is respectively controlled on 6%/94%.

Example 10 used in each treatment space 5 a common air as gas-mixture. In all examples PET samples were used as substrate 6.

Comparative Example 1

A barrier film is deposited on a PET ST505 (Melinex) from DuPont Tejin Films (width: 20 cm/thickness 100 µm) using the electrode set-up as shown in FIG. 1 using an atmospheric pressure plasma device 10 and one treatment space 5. On the sides of the substrate 6 facing the plasma discharge a SiOx layer 14 of 25 nm is deposited. The WVTR was checked by Mocon Aquatran and the dynamic scaling components α, β and z were determined by AFM (Veeco).

The substrate is as next step laminated to another PET ST505 (Melinex) from DuPont Tejin Films (width: 20 cm/thickness 100 µm) in a laminator with its facing barrier side using a hydrophobic acrylate of 10 micron which was followed by UV-curing.

The laminate was than checked on adhesion via the Damp heat test described above.

Comparative Example 2

A barrier film is deposited using the electrode set-up as shown in FIG. 1 using an atmospheric pressure plasma device 10 and one treatment space 5. On the sides of the substrate 6 facing the plasma discharge a SiOx layer 14 of 50 nm is deposited. The WVTR was checked by Mocon Aquatran and the dynamic scaling components α, β and z were determined by AFM (Veeco).

The substrate is as next step laminated to another PET ST505 (Melinex) from DuPont Tejin Films (width: 20 cm/thickness: 100 µm) in a laminator with its facing barrier side using a hydrophobic acrylate of 10 micron which was followed by UV-curing.

The laminate was than checked on adhesion via the Damp Heat test described above.

Comparative Example 3

A barrier film is deposited using the electrode set-up in FIG. 1 using two treatment spaces. On the sides of the substrate 6 facing the plasma discharge a SiOx layer 30 nm is deposited in each treatment space.

The WVTR was checked by Mocon Aquatran and the dynamic scaling components α, β and z were determined by AFM (Veeco).

The substrate is as next step laminated to another PET ST505 (Melinex) from DuPont Tejin Films (width: 20 cm/thickness: 100 µm) in a laminator with its facing barrier side using a hydrophobic acrylate of 10 micron which was followed by UV-curing.

The laminate was than checked on adhesion via the Damp Heat test described above.

Example 4

A barrier film is deposited using the electrode set-up in FIG. 1 using three treatment spaces. On the sides of the substrate 6 facing the plasma discharge a SiOx layer 20 nm is deposited in each treatment space.

The WVTR was checked by Mocon Aquatran and the dynamic scaling components α, β and z were determined by AFM (Veeco).

The substrate is as next step laminated to another PET ST505 (Melinex) from DuPont Tejin Films (width: 20 cm/thickness: 100 μm) in a laminator with its facing barrier side using a hydrophobic acrylate of 10 micron which was followed by UV-curing.

The laminate was than checked on adhesion via the Damp Heat test described above.

Example 5

A barrier film is deposited using the electrode set-up in FIG. 1 using four treatment spaces. On the sides of the substrate 6 facing the plasma discharge a SiOx layer 15 nm is deposited in each treatment space.

The WVTR was checked by Mocon Aquatran and the dynamic scaling components α, β and z were determined by AFM (Veeco).

The substrate is as next step laminated to another PET ST505 (Melinex) from DuPont Tejin Films (width: 20 cm/thickness: 100 μm) in a laminator with its facing barrier side using a hydrophobic acrylate of 10 micron which was followed by UV-curing.

The laminate was than checked on adhesion via the Damp Heat test described above.

Example 6

A barrier film is deposited using the electrode set-up in FIG. 1 using four treatment spaces. On the sides of the substrate 6 facing the plasma discharge a SiOx layer 15 nm is deposited in each treatment space.

The WVTR was checked by Mocon Aquatran and the dynamic scaling components α, β and z were determined by AFM (Veeco).

The substrate is as next step laminated to another PET ST505 (Melinex) from DuPont Tejin Films (width: 20 cm/thickness: 100 μm) in a laminator with its facing barrier side using a hydrophobic acrylate of 10 micron which was followed by UV-curing.

The laminate was than checked on adhesion via the Damp Heat test described above.

Example 7

A barrier film is deposited using the electrode set-up in FIG. 1 using three treatment spaces. On the sides of the substrate 6 facing the plasma discharge a SiOx layer 20 nm is deposited in each treatment space.

The WVTR was checked by Mocon Aquatran and the dynamic scaling components α, β and z were determined by AFM (Veeco).

The substrate is as next step laminated to another PET ST505 (Melinex) from DuPont Tejin Films (width: 20 cm/thickness: 100 μm) in a laminator with its facing barrier side using a hydrophobic acrylate of 10 micron which was followed by UV-curing.

The laminate was than checked on adhesion via the Damp Heat test described above.

Example 8

A barrier film is deposited using the electrode set-up in FIG. 1 using three treatment spaces. On the sides of the substrate 6 facing the plasma discharge a SiOx layer 20 nm is deposited in each treatment space. Compared to example 7 in the treatment space the $O_2/N_2$-mixture is controlled on 1%/99%.

The WVTR was checked by Mocon Aquatran and the dynamic scaling components α, β and z were determined by AFM (Veeco).

The substrate is as next step laminated to another PET ST505 (Melinex) from DuPont Tejin Films (width: 20 cm/thickness: 100 μm) in a laminator with its facing barrier side using a hydrophobic acrylate of 10 micron which was followed by UV-curing.

The laminate was than checked on adhesion via the Damp Heat test described above.

Example 9

A barrier film is deposited using the electrode set-up in FIG. 1 using three treatment spaces. On the sides of the substrate 6 facing the plasma discharge a SiOx layer 20 nm is deposited in each treatment space. Compared to example 7 in the treatment space the $O_2/N_2$-mixture is controlled on 1%/99%.

The WVTR was checked by Mocon Aquatran and the dynamic scaling components α, β and z were determined by AFM (Veeco).

The substrate is as next step laminated to another PET ST505 (Melinex) from DuPont Tejin Films (width: 20 cm/thickness: 100 μm) in a laminator with its facing barrier side using a hydrophobic acrylate of 10 micron which was followed by UV-curing.

The laminate was than checked on adhesion via the Damp Heat test described above.

Example 10

A barrier film is deposited using the electrode set-up in FIG. 1 using three treatment spaces. On the sides of the substrate 6 facing the plasma discharge a SiOx layer 20 nm is deposited in each treatment space. Compared to example 7 in the treatment space air was used as gas mixture.

The WVTR was checked by Mocon Aquatran and the dynamic scaling components α, β and z were determined by AFM (Veeco).

The substrate is as next step laminated to another PET ST505 (Melinex) from DuPont Tejin Films (width: 20 cm/thickness: 100 μm) in a laminator with its facing barrier side using a hydrophobic acrylate of 10 micron which was followed by UV-curing.

The laminate was then checked on adhesion by the Damp Heat test described above.

TABLE 1

|  | WVTR (g/m²·day) | D.H. (500 hrs) | D.H. (1000 hrs) | D.H. (1500 hrs) | D.H. (2000 hrs) | α | β | Z |
|---|---|---|---|---|---|---|---|---|
| Ex. 1 | 0.07 | XX | n.d. | n.d. | n.d. | 0.901 | 0.137 | 6.6 |
| Ex. 2 | $6.1 * 10^{-3}$ | X | XX | n.d. | n.d. | 0.906 | 0.120 | 7.6 |

TABLE 1-continued

|       | WVTR (g/m² · day) | D.H. (500 hrs) | D.H. (1000 hrs) | D.H. (1500 hrs) | D.H. (2000 hrs) | α | β | Z |
|-------|-------------------|----------------|-----------------|-----------------|-----------------|-------|-------|------|
| Ex. 3 | $4.1 * 10^{-3}$  | C | X  | X    | XX   | 0.899 | 0.091 | 10.0 |
| Ex. 4 | $7.8 * 10^{-4}$  | O | O  | O    | O~C  | 0.910 | 0.088 | 10.3 |
| Ex. 5 | $<5 * 10^{-4}$   | O | O  | O    | O    | 0.926 | 0.064 | 14.5 |
| Ex. 6 | $<5 * 10^{-4}$   | O | O  | O    | O    | 0.927 | 0.063 | 14.6 |
| Ex. 7 | $<5 * 10^{-4}$   | O | O  | O    | O    | 0.937 | 0.078 | 12.0 |
| Ex. 8 | $7.8 * 10^{-3}$  | X | XX | n.d. | n.d. | 0.929 | 0.257 | 3.6  |
| Ex. 9 | $<5 * 10^{-4}$   | O | O  | O    | O    | 0.901 | 0.058 | 15.5 |
| Ex. 10| $<5 * 10^{-4}$   | O | O  | O    | O    | 0.929 | 0.065 | 14.3 | n.d. = not done
D.H. = damp heat test

The invention claimed is:

1. A method for manufacturing a water vapour barrier layer on a flexible substrate, comprising
depositing an inorganic layer on the substrate in a treatment space, the treatment space being formed between at least two electrodes for generating an atmospheric pressure glow discharge plasma, characterized in that (i) the barrier layer is formed by at least three subsequent inorganic layer depositions on the substrate, each inorganic layer deposition being at most 20 nm in thickness and (ii) the method is performed with a duty cycle of 100%.

2. The method of claim 1, wherein a gas atmosphere is provided in each treatment space, the gas atmosphere comprising between 4 and 25% of oxygen.

3. The method of claim 1, wherein each inorganic layer deposited is at least 5 nm thick.

4. The method of claim 1, wherein the deposited inorganic layer has dynamic scaling components properties comprising a α-value of about 0.9, a β-value below 0.2 and a z-value above 6.

5. The method of claim 1, wherein the at least three inorganic layer depositions are each being executed in separate treatment spaces.

6. The method of claim 1, wherein two of the at least three inorganic layer depositions are being executed in the same treatment space.

7. The method of claim 1, wherein two, three, or all of the at least three inorganic layers are formed of the same material.

8. The method of claim 1, further comprising
manufacturing a sheet structure, the sheet structure comprising in order
a substrate, a barrier layer, an adhesive layer, and a second substrate, by laminating a substrate with a barrier layer and a second substrate with an adhesive layer on the facing surface of the barrier layer.

9. The method according to claim 8, further comprising laminating two or more sheet structures with an additional adhesive layer in between.

10. The method according to claim 8, further comprising treating the second substrate using an atmospheric pressure glow discharge plasma.

11. The method according to claim 8, wherein the substrate and the second substrate are provided on a roll to obtain the sheet structure in a continuous process.

12. The method according to claim 8, in which the substrate and second substrate are treated simultaneously.

13. The method according to claim 8, in which two substrates are treated in the same treatment spaces.

14. The method according to claim 8, wherein the substrate is a substrate of PET or PEN with a thickness of about 20-100 µm.

15. The method according to claim 8, wherein the second substrate is a substrate of PET or PEN with a thickness of about 100-300 µm.

16. The method according to claim 8, further comprising laminating two or more sheet structures with an additional adhesive layer in between, wherein the substrate and the second substrate are provided on a roll to obtain the sheet structure in a continuous process, the substrate is a substrate of PET or PEN with a thickness of about 20-100 µm and the second substrate is a substrate of PET or PEN with a thickness of about 100-300 µm.

* * * * *